(12) United States Patent
Choi et al.

(10) Patent No.: US 7,314,806 B2
(45) Date of Patent: Jan. 1, 2008

(54) METHODS OF FORMING METAL-INSULATOR-METAL (MIM) CAPACITORS WITH SEPARATE SEED

(75) Inventors: Jae-hyoung Choi, Gyeonggi-do (KR); Sung-tae Kim, Seoul (KR); Ki-chul Kim, Gyeonggi-do (KR); Cha-young Yoo, Suwon (KR); Jeong-hee Chung, Seoul (KR); Se-hoon Oh, Seoul (KR); Jeong-sik Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/097,404

(22) Filed: Apr. 1, 2005

(65) Prior Publication Data

US 2005/0227432 A1    Oct. 13, 2005

(30) Foreign Application Priority Data

Apr. 12, 2004    (KR) .................... 10-2004-0024888

(51) Int. Cl.
    *H01L 21/20*    (2006.01)
(52) U.S. Cl. ................ 438/393; 438/785; 257/E21.01; 257/E21.021
(58) Field of Classification Search ................ 438/393, 438/785; 257/E21.01, E21.021
    See application file for complete search history.

(56) References Cited

U.S. PATENT DOCUMENTS 5,374,578 A    12/1994    Patel et al.
5,440,157 A    8/1995    Imai et al.
5,641,702 A    6/1997    Imai et al.

(Continued)

FOREIGN PATENT DOCUMENTS

KR    10-1997-0018537    4/1997

(Continued)

OTHER PUBLICATIONS

Notice to Submit a Response for Korean Patent Application No. 10-2004-0024888 mailed on Dec. 14, 2005.

(Continued)

*Primary Examiner*—Trung Dang
(74) *Attorney, Agent, or Firm*—Myers, Bigel, Sibley & Sajovec, P.A.

(57) ABSTRACT

A metal-oxy-nitride seed dielectric layer can be formed on a metal-nitride lower electrode of a metal-insulator-metal (MIM) type capacitor. The metal-oxy-nitride seed dielectric layer can act as a barrier layer to reduce a reaction with the metal-nitride lower electrode during, for example, backend processing used to form upper levels of metallization/structures in an integrated circuit including the MIM type capacitor. Nitrogen included in the metal-oxy-nitride seed dielectric layer can reduce the type of reaction, which may occur in conventional type MIM capacitors. A metal-oxide main dielectric layer can be formed on the metal-oxy-nitride seed dielectric layer and can remain separate from the metal-oxy-nitride seed dielectric layer in the MIM type capacitor. The metal-oxide main dielectric layer can be stabilized (using, for example, a thermal or plasma treatment) to remove defects (such as carbon) therefrom and to adjust the stoichiometry of the metal-oxide main dielectric layer.

18 Claims, 12 Drawing Sheets

U.S. PATENT DOCUMENTS

| | | | |
|---|---|---|---|
| 6,063,639 A | 5/2000 | Kim et al. | |
| 6,201,276 B1 * | 3/2001 | Agarwal et al. | 257/315 |
| 6,509,200 B2 | 1/2003 | Koyanagi | |
| 6,670,256 B2 * | 12/2003 | Yang et al. | 438/396 |
| 6,995,071 B2 | 2/2006 | Oh et al. | |
| 2002/0106536 A1 | 8/2002 | Lee et al. | |
| 2002/0137239 A1 | 9/2002 | Koyanagi | |
| 2002/0190294 A1 | 12/2002 | Iizuka et al. | |
| 2002/0195643 A1 | 12/2002 | Harada | |
| 2004/0009678 A1 | 1/2004 | Asai et al. | |
| 2004/0011380 A1 | 1/2004 | Ji et al. | |
| 2004/0043569 A1 | 3/2004 | Ahn et al. | |

FOREIGN PATENT DOCUMENTS

| | | |
|---|---|---|
| KR | 1020000045296 | 7/2000 |
| KR | 1020010017212 | 3/2001 |
| KR | 1020010060981 | 7/2001 |
| KR | 1020020034710 | 5/2002 |
| KR | 10-2003-0002022 | 1/2003 |
| KR | 1020030005021 | 1/2003 |

OTHER PUBLICATIONS

Notice to Submit a response for Korean Patent Application No. 10-2003-0029368 mailed Apr. 29, 2005.

Boulos "New Frontiers in Thermal Plasma Processing" *Pure & Applied Chemistry* 68(5): 1007-1010 (1996).

\* cited by examiner

BINDING ENERGY

US 7,314,806 B2

METHODS OF FORMING METAL-INSULATOR-METAL (MIM) CAPACITORS WITH SEPARATE SEED

CROSS-REFERENCE TO RELATED APPLICATIONS

This application claims priority to Korean Patent Application No. 2004-24888, filed in the Korean Intellectual Property Office on Apr. 12, 2004, and to U.S. patent application Ser. No. 10/830,214; filed in the United States Patent Office on Apr. 22, 2004, the contents of which are incorporated herein by reference in their entireties.

FIELD OF THE INVENTION

The invention relates to the fabrication of integrated circuits, and more particularly, to the formation of metal-insulator-metal (MIM) type capacitors.

BACKGROUND

As the density of integrated circuits has increased, there is increasing need to reduce the size of associated capacitors in, for example, Dynamic Random Access Memories (DRAMs). However, there is also a need to increase the per unit area capacitance of such capacitors, which may be difficult given that the overall size of the capacitors may be reduced for use in highly integrated circuits. For example, it has been known to use $SiO_2$ dielectric layers in Metal-Insulator-Semiconductor (MIS) capacitors using a three-dimensional structure to compensate for the reduced thickness of the dielectric layer. In other words, a three-dimensional structure has been used to increase the effective surface area of the electrodes despite the reduction in size of the capacitor. Such MIS conventional capacitors, however, may not be suitable for use in all highly integrated circuits.

To address some of the shortcomings of MIS capacitors, it is known to use metal-insulator-metal (MIM) capacitors where the dielectric layer is formed using a metal oxide that has a high oxygen affinity. For example, it is known to use metal oxides such as $Ta_2O_5$, $Y_2O_3$, $La_2O_5$, $Pr_2O_3$, $Nb_2O_5$, $TiO_2$, BaO, SrO, $HfO_2$ and BST. In particular, an $HfO_2$ layer can have a relatively high dielectric constant (e.g., about 20-25) and a high band gap. These properties of the $HfO_2$ dielectric layer (unlike other dielectric layers having high-dielectric constant) may provide relatively good reliability and stability in integrated circuit memory devices.

FIG. 1 is a graph showing leakage currents in a conventional MIM type capacitor. In particular, the capacitor leakage currents shown in FIG. 1 correspond to a MIM type capacitor having TiN electrodes and an $HfO_2$ dielectric material therebetween. According to FIG. 1, the curve labeled (A) shows that the leakage current may be relatively low after initial formation of the MIM type capacitor. However, curves (B) and (C) illustrate that the leakage current of the MIM type capacitors after anneal of 500° C. and 550° C., respectively. The leakage currents can be increased due to back-end processing, which can include forming an inter-layer dielectric, a barrier metal layer, and an inter-metal dielectric layer, after the formation of the MIM type capacitor. The formation of a barrier metal may take place at a relatively high temperature of 550° C. to 700° C.

The increase in leakage current described above can occur due to the crystallization of the $HfO_2$ layer and/or a reaction between the $HfO_2$ layer and the TiN electrodes. Furthermore, differences in the thermal expansion of the electrodes and the dielectric layer can also contribute to increased stress in the capacitor. All of these factors can contribute to an increase in the equivalent oxide thickness of the dielectric layer, which in turn can contribute to an increase in leakage current.

The crystallinity of $HfO_2$ layers is known to depend on the post treatment, especially, on temperature and method. FIG. 2 shows the amount of crystallization in the $HfO_2$ layer immediately after formation of a 60 Å-thick $HfO_2$ dielectric layer (Curve A), after thermal processing of a 60 Å $HfO_2$ layer in a vacuum (Curve B) at 650° C., and after plasma processing of a 60 Å $HfO_2$ layer in an $H_3$ plasma at 390° C. (Curve C). According to FIG. 2, the $HfO_2$ layer subject to plasma processing at 390° C. demonstrates about the same amount of crystallization as that exhibited by dielectric layers subject to a high temperature thermal processing. Even the crystallinity of $HfO_2$ layers after both treatments is the same, the leakage current behavior is considerably different because of the lower temperature in plasma treatment.

SUMMARY

Embodiments according to the invention can provide methods of forming metal-insulator-metal (MIM) capacitors with separate seed and main dielectric layers and MIM capacitors so formed. Pursuant to these embodiments, a method of forming a dielectric layer in a capacitor can include forming a metal-oxy-nitride seed dielectric layer on a metal-nitride lower electrode.

In some embodiments according to the invention, the method further includes forming a metal-oxide main dielectric layer on the metal-oxy-nitride seed dielectric layer separate from the metal-oxy-nitride seed dielectric layer. In some embodiments according to the invention, the method further includes forming a metal-oxy-nitride main dielectric layer on the metal-oxy-nitride seed dielectric layer.

In some embodiments according to the invention, a first metal constituent in the metal-nitride lower electrode and a second metal constituent in the metal-oxy-nitride seed dielectric layer are different metal constituents. In some embodiments according to the invention, the different metal constituents are Ti, W, Ta, Hf, Zr, or La. In some embodiments according to the invention, a first metal constituent in the metal-oxy-nitride seed dielectric layer and a second metal constituent in the metal-oxide main dielectric layer are the same metal constituent. In some embodiments according to the invention, the same metal constituent is Ti, W, Ta, Hf, Zr, or La.

In some embodiments according to the invention, a metal constituent in the metal-oxide main dielectric layer and a metal constituent in the metal-oxy-nitride seed dielectric layer are the same metal constituents. In some embodiments according to the invention, a second metal constituent in the metal-oxide main dielectric layer and a first metal constituent in the metal-oxy-nitride seed dielectric layer are different metal constituents. In some embodiments according to the invention, the different metal constituents are Ti, W, Ta, Hf, Zr, or La.

In some embodiments according to the invention, the method further includes forming the metal-oxy-nitride seed dielectric layer to a thickness of about 20 to about 60 Angstroms and forming the metal-oxide main dielectric layer to a thickness of about 40 to about 100 Angstroms.

In some embodiments according to the invention, the method further includes forming a separate metal-oxide main dielectric layer on the metal-oxy-nitride seed dielectric layer. In some embodiments according to the invention, the method further includes treating the metal-oxide main dielectric layer using thermal treatment or plasma treatment. In some embodiments according to the invention, the method further includes treating the metal-oxide main dielectric layer using the thermal treatment or the plasma treatment in a non-oxygen atmosphere.

In some embodiments according to the invention, the non-oxygen atmosphere includes $H_2$, $NH_3$ and/or $N_2$. In some embodiments according to the invention, treating the metal-oxide main dielectric layer using thermal treatment includes treating the metal-oxide main dielectric layer in an oxygen atmosphere at a temperature less than about 550 Centigrade. In some embodiments according to the invention, the oxygen atmosphere includes $O_2$, $NO_2$ and/or $N_2O$.

In some embodiments according to the invention, treating the metal-oxide main dielectric layer using plasma treatment includes treating metal-oxide main dielectric layer using plasma treatment in an oxygen atmosphere at a temperature less than about 550 Centigrade. In some embodiments according to the invention, forming a metal-oxy-nitride seed dielectric layer includes forming a thin metal-oxy seed dielectric layer on the metal-nitride lower electrode and nitriding the thin metal-oxy seed dielectric layer.

In some embodiments according to the invention, nitriding includes using a plasma treatment in a nitrogen atmosphere at a temperature of about 200 degrees Centigrade and about 550 degrees Centigrade. In some embodiments according to the invention, nitriding includes a thermal treatment in a nitrogen atmosphere at a temperature less than or equal to about 550 degrees Centigrade.

In some embodiments according to the invention, the method further includes forming an upper electrode on the metal-oxide main dielectric layer, wherein a metal constituent included in the upper electrode is different than a metal constituent included in metal-oxide main dielectric layer.

In some embodiments according to the invention, a method of forming a capacitor includes forming a separate metal-oxide main dielectric layer on a metal-oxy-nitride seed dielectric layer on a metal-nitride lower electrode and treating the separate metal-oxide main dielectric layer using thermal a treatment or a plasma treatment.

In some embodiments according to the invention, a Metal-Insulator-Metal (MIM) type capacitor includes a metal-nitride lower capacitor electrode on a substrate and a metal-oxy-nitride seed dielectric layer on the metal-nitride lower capacitor electrode.

Figure 1:
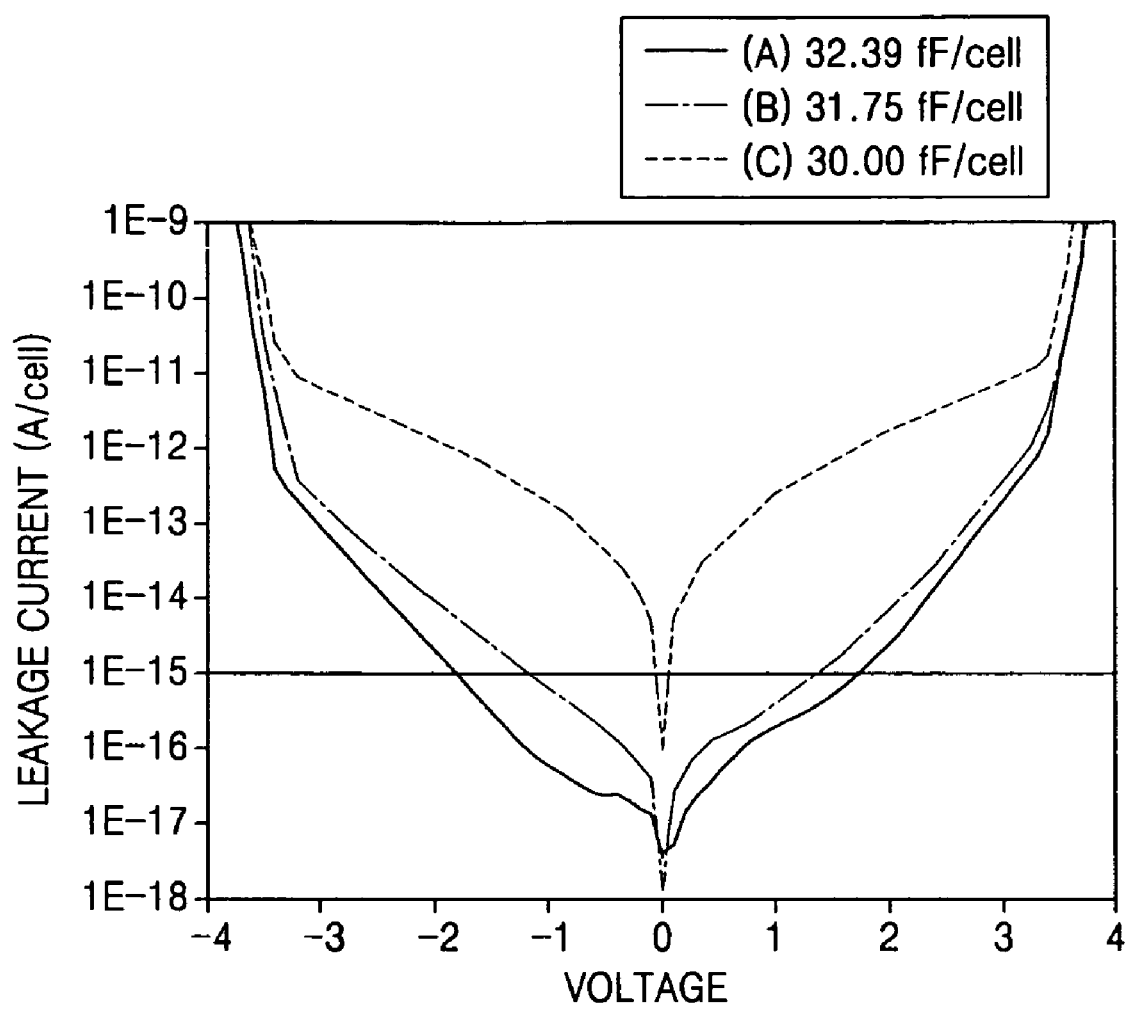
FIG. 1 is a graph that illustrates leakage currents in conventional MIM type capacitors measured at different stages of manufacturing.
Figure 2:
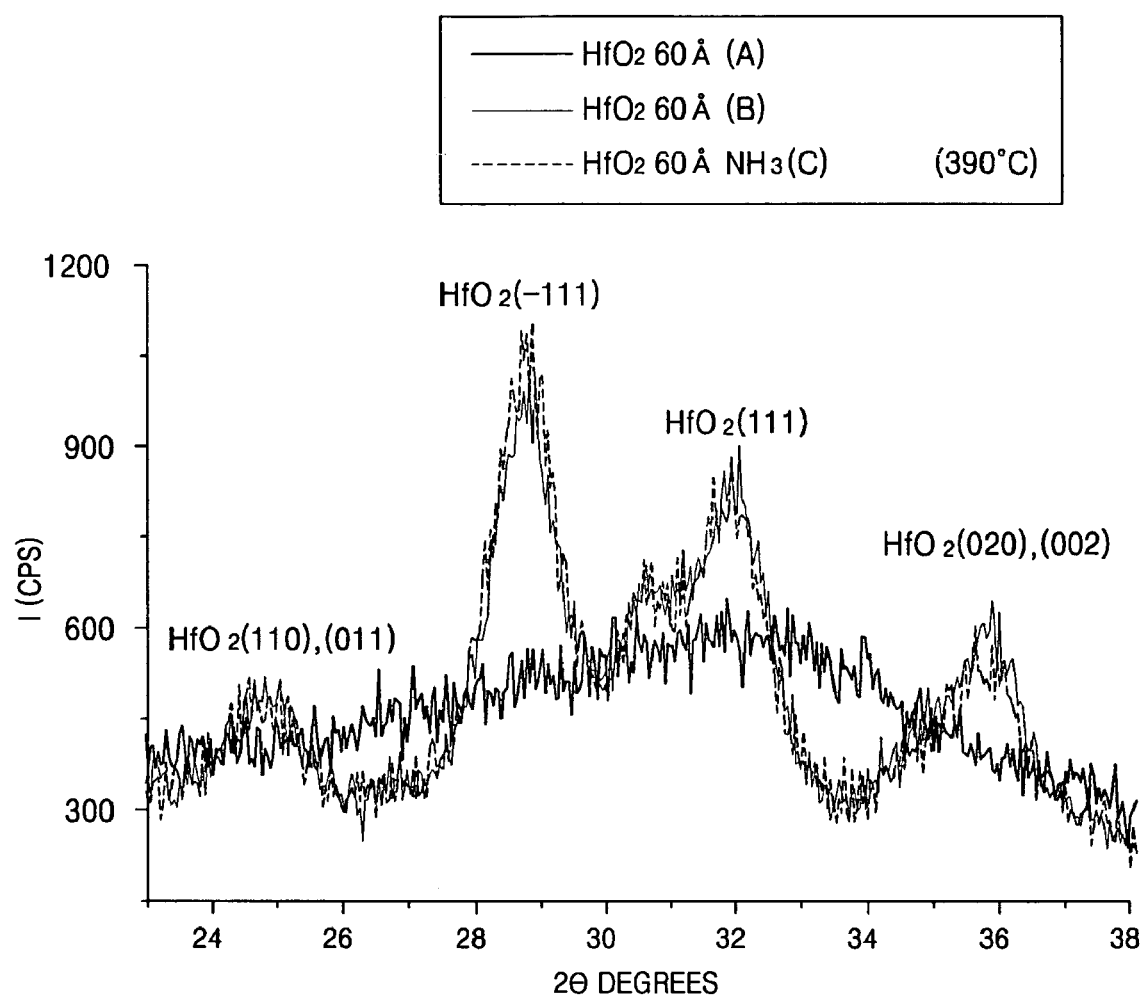
FIG. 2 is a graph showing x-ray diffractometer data measured in conventional MIM type capacitors at different stages of fabrication.

DESCRIPTION OF EMBODIMENTS
ACCORDING TO THE INVENTION

The invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section (and/or plan view) illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

As disclosed herein in greater detail, in some embodiments according to the invention, a metal-oxy-nitride seed dielectric layer can be formed on a metal-nitride lower electrode of a metal-insulator-metal (MIM) type capacitor. The metal-oxy-nitride seed dielectric layer can act as a barrier layer to reduce a reaction with the metal-nitride lower electrode during, for example, backend processing used to form upper levels of metallization/structures in an integrated circuit including the MIM type capacitor. The metal-oxy-nitride seed dielectric layer may also reduce stress that could otherwise be induced during backend thermal processing. In particular, the nitrogen included in the metal-oxy-nitride seed dielectric layer can reduce the type of reaction, which may occur in conventional type MIM capacitors. In further embodiments according to the invention, a metal-oxide main dielectric layer can be formed on the metal-oxy-nitride seed dielectric layer and can remain separate from the metal-oxy-nitride seed dielectric layer in the MIM type capacitor. Furthermore, in some embodiments according to the invention, the metal-oxide main dielectric layer can be stabilized (using, for example, a thermal or plasma treatment) to remove defects (such as carbon) therefrom and to adjust the stoichiometry of the metal-oxide main dielectric layer.

Figure 3:
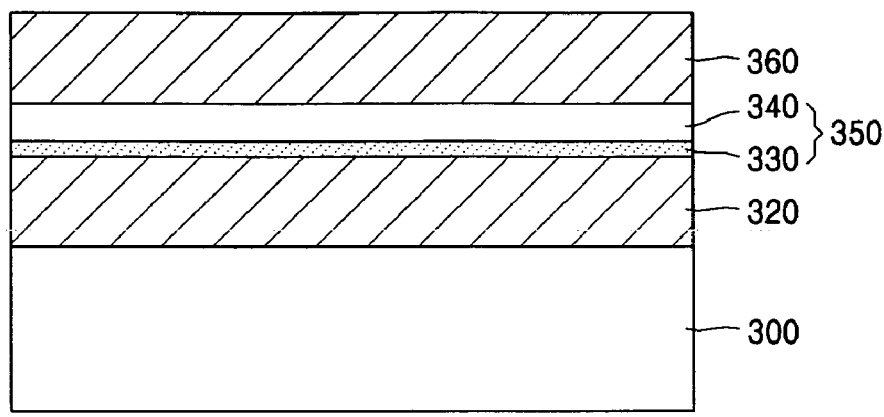
FIG. 3 is a cross-sectional view of a MIM type capacitor according to some embodiments of the invention.

FIG. 3 is a cross-sectional view of a MIM type capacitor according to some embodiments of the invention. As shown in FIG. 3, a lower electrode 320 of the MIM type capacitor is formed on a substrate 300 (such a polysilicon substrate). The lower electrode 320 includes a metal constituent, such as Ti, W, and/or Ta.

A metal-oxy-nitride seed dielectric layer 330 is located on the lower electrode 320. The metal-oxy-nitride seed dielectric layer 330 includes a second metal constituent that is different from the first metal constituent included in the lower electrode 320. As discussed above, the nitrogen included in the metal-oxy-nitride seed dielectric layer 330 can act as a barrier layer to reduce a reaction between the lower electrode 320 and the dielectric layer during backend processing, which may, for example, reduce the degree of crystallization in the dielectric layer induced by the backend processing thereby reducing the amount of growth in the equivalent oxide thickness. The metal-oxy-nitride seed dielectric layer 330 can be a relatively thin layer included in the dielectric layer. For example, the metal-oxy-nitride seed dielectric layer can have a thickness of about 20 Å to about 60 Å.

A metal-oxide main dielectric layer 340 is located on the metal-oxy-nitride seed dielectric layer 330. The metal-oxide main dielectric layer 340 can preferably include the same metal constituent included in the metal-oxy-nitride seed dielectric layer 330. Furthermore, the metal-oxide main dielectric layer 340 can be relatively thick compared to the metal-oxy-nitride seed dielectric layer 330. For example, the metal-oxide main dielectric layer 340 can have a thickness of about 40 Å to about 100 Å.

The metal-oxy-nitride seed dielectric layer 330 and the metal-oxide main dielectric layer 340 can be separate layers in the MIM type capacitor dielectric 350. As described above, the metal-oxy-nitride seed dielectric layer 330 can act as a barrier layer to reduce a potential reaction between the lower electrode and the dielectric layer, which may otherwise adversely affect the properties of the MIM type capacitor, such as the leakage current.

An upper electrode 360 is located on the metal-oxide main dielectric layer 340 can be include the same material included in the lower electrode 420. It can include a third metal constituent, which is different than the metal constituents included in the lower electrode 320 and the metal-oxy-nitride seed dielectric layer 330, as well as the metal oxide main dielectric layer 350. For example, the upper electrode 360 can include a metal constituent such as Ru, Pt, and/or Ir.

Figure 4:
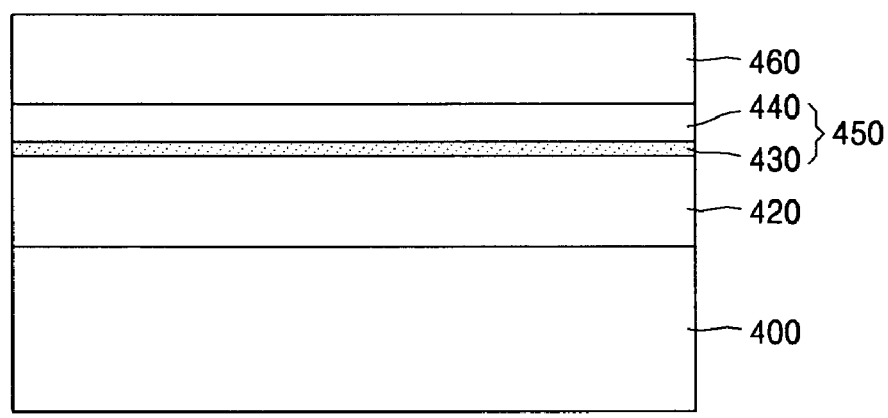
FIG. 4 is a cross-sectional view of MIM type capacitors according to some embodiment of the invention.
Figure 5:
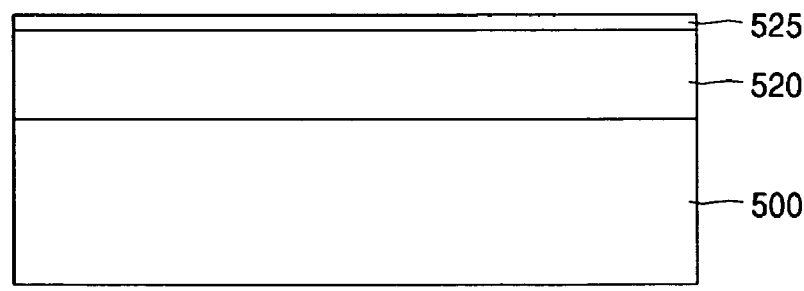
FIGS. 5-11 are cross-sectional views that illustrate the formation of MIM type capacitors according to some embodiments of the present invention.

FIG. 4 is a cross-sectional view of a MIM type capacitor according to some embodiments of the invention. According to FIG. 4, a TiN lower electrode layer 420 is located on a substrate 400. A HfON seed dielectric layer 430 is located on the TiN lower electrode 420. In some embodiments according to the invention, the seed dielectric layer can be ZrON, LaON or the like. As described above, the seed dielectric layer 430 can be relatively thin and can act as a barrier layer to reduce a reaction between the lower electrode 420 and the dielectric layer 430, which may otherwise adversely affect the leakage current of the MIM type capacitor. Furthermore, the seed dielectric layer 430 may act to reduce stress that may otherwise be induced during back-end processing. Furthermore, the seed dielectric layer 430 may effectively raise the crystallization temperature of the dielectric MIM type capacitor by reducing the degree of the reactions described above.

An $HFO_2$ main dielectric layer 440 is on the HfON seed dielectric layer and therefore includes the same metal constituent used in the HfON seed dielectric layer 430. Furthermore, the $HfO_2$ main dielectric layer 440 and the HfON seed dielectric layer 430 are formed as separate layers of the dielectric 450 of the MIM type capacitor. An upper electrode 460 is formed on the dielectric 450 and includes the same material included in the lower electrode 420 (i.e., TiN in this case). In some embodiments according to the invention, the upper electrode 460 can include TaN, WN or the like.

FIGS. 5-11 are cross-sectional views that illustrate the formation of a MIM type capacitor according to some embodiments of the invention. According to FIG. 5, a TiN lower electrode 520 is formed on a substrate 500 of a MIM type capacitor according to embodiments of the invention. The lower electrode 520 can be formed using Atomic Layer Deposition (ALD), Chemical Vapor Deposition (CVD), or Metal Organic CVD (MOCVD).

An $HfO_2$ layer 525 is formed on the lower electrode 520 using, for example, ALD. As understood by those skilled in the art, ALD refers to the formation of a structure one layer at a time using precursor gases. In particular, a monolayer of a first constituent, such as Hf, can be formed using a first precursor gas that includes the Hf along with the precursor material to form a monolayer on a substrate. A second precursor gas including another constituent (such as an oxide) to be combined with the metal constituent included in the first precursor gas is introduced, which reacts with the monolayer on the substrate to provide the final monolayer combining the first metal constituent with the constituent in the second precursor gas to form, in the above case, the $HfO_2$ monolayer.

Figure 6:
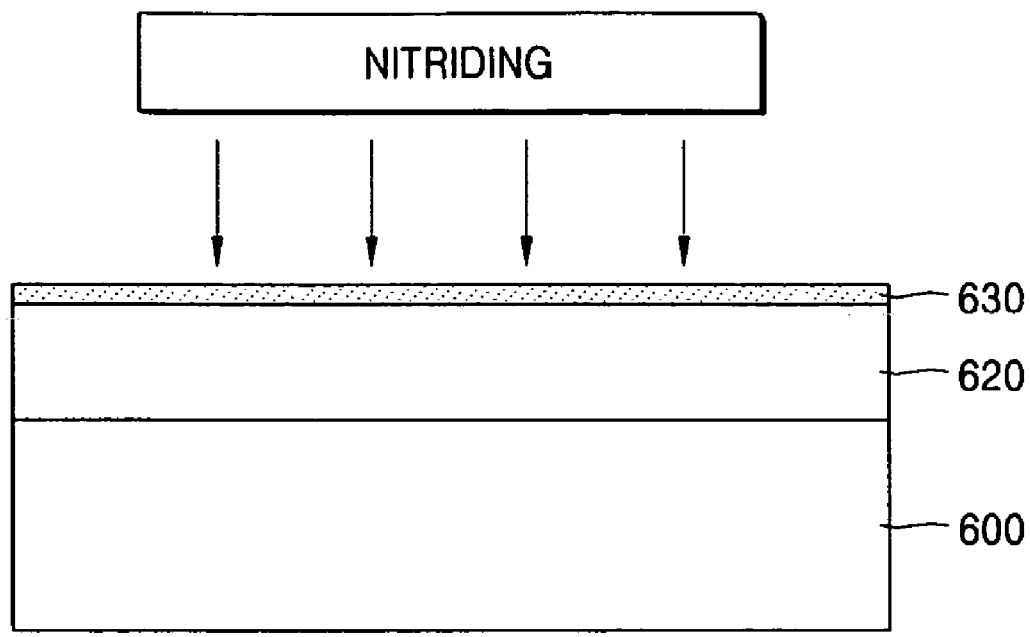

According to FIG. 6, the $HfO_2$ layer 525 is nitrided by a thermal treatment or a plasma treatment to provide an HfON seed dielectric layer 530 on lower electrode 520. The thermal treatment may be provided at a relatively low temperature (such as about 200° C. to about 550° C.). Nitriding the $HfO_2$ layer 525 using the relatively low thermal treatment may avoid the undesirable effects of oxidation of the TiN lower electrode 520 and/or the reaction between the TiN lower electrode 520 and the seed $HfO_2$ layer 530, which may otherwise reduce the dielectric constant and band gap of the dielectric layer so formed. In some embodiments according to the invention, the nitridation of the $HfO_2$ layer 525 is performed in an atmosphere including $N_2$, $NH_3$, $N_2O$ and/or $NO_2$.

Figure 7:
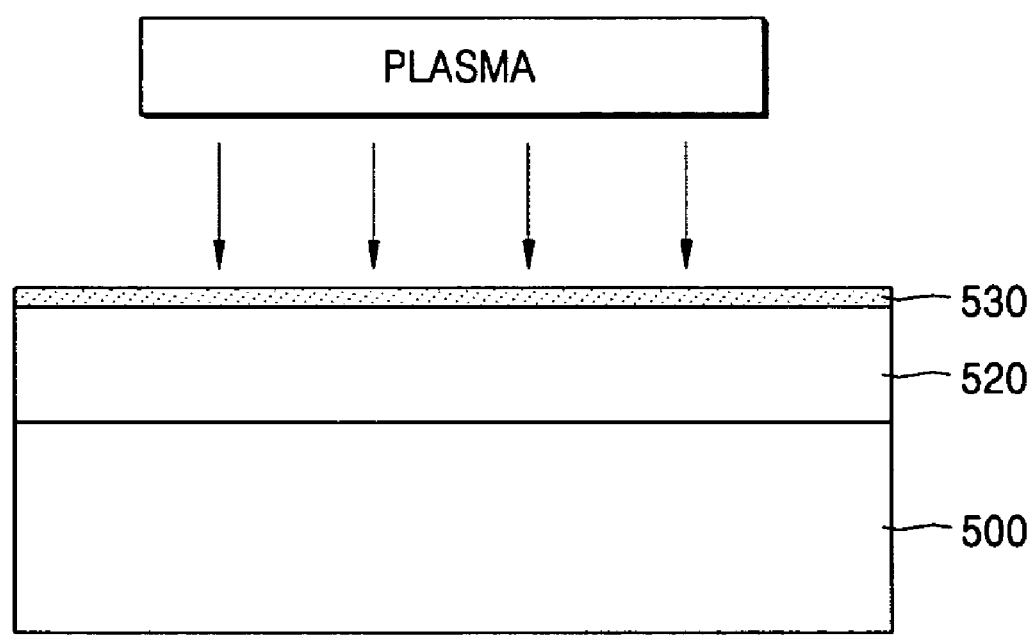

According to FIG. 7, in some embodiments according to the invention, the $HfO_2$ layer 525 is nitrided using a plasma treatment in an atmosphere including $N_2$, $NH_3$, $N_2O$ and/or $NO_2$ at a relatively low temperature of about 200° C. to about 550° C. to form the HfON seed dielectric layer 530 on the lower electrode 520. As described above, nitriding the $HfO_2$ layer at a relatively low temperature can help avoid adverse effects on the dielectric layer. Furthermore, the use of plasma treatment may further increase the formation of radicals, which may further enhance the composition of the HfON seed dielectric layer 530.

Figure 8:
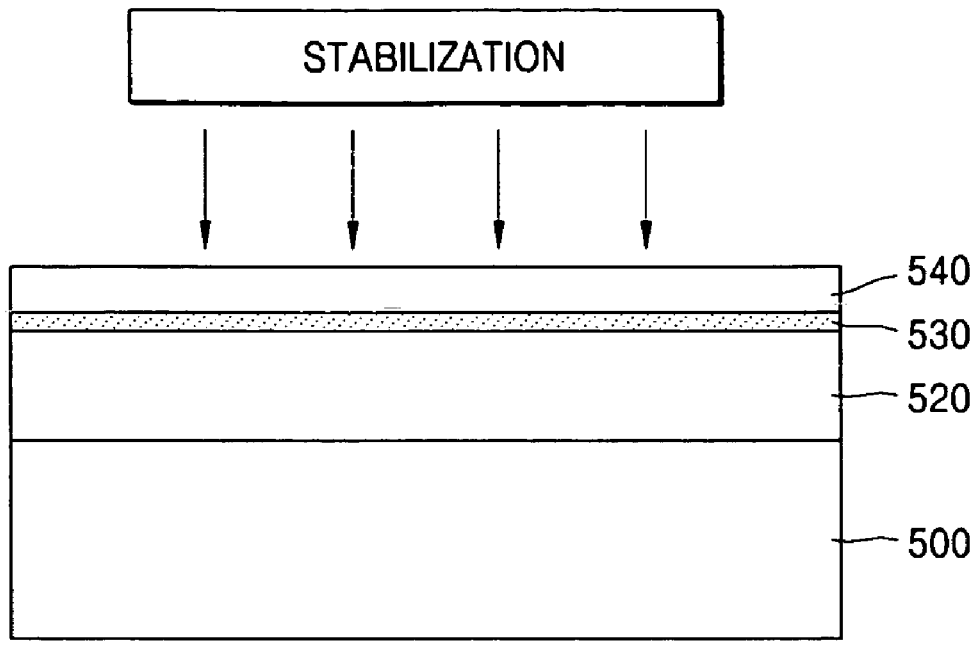

According to FIG. 8, a $HfO_2$ main dielectric layer 540 is formed on the HfON seed dielectric layer 530 as a separate layer. In particular, the $HfO_2$ main dielectric layer 540 may be grown on the HfON seed dielectric layer 530 using ALD or MOCVD. Furthermore, the $HfO_2$ main dielectric layer 540 is subject to a stabilization treatment to reduce carbon impurities in a $HfO_2$ layer, as well as to improve the stoichiometry of the $HfO_2$ main dielectric layer 540 formed at a relatively low temperature (such as less than about 550° C.).

Figure 9:
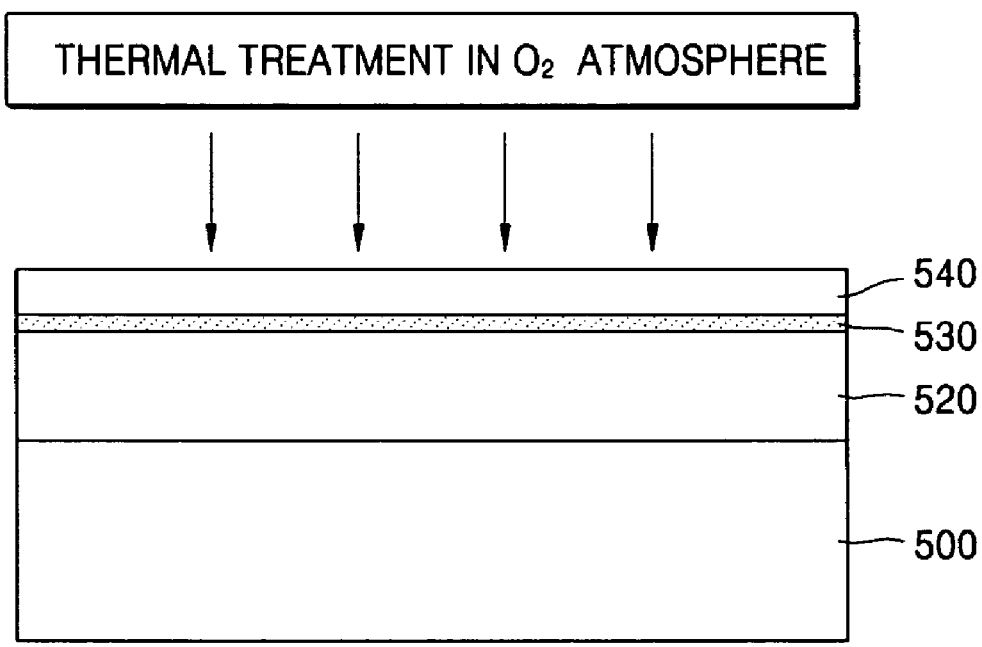

For example, according to FIG. 9, the thermal stabilization treatment is performed in an oxygen environment (using, for example, $O_2$, $N_2O$ and/or $NO_2$) to provide the appropriate amount of oxygen material to the main dielectric layer for proper formation of the $HfO_2$ main dielectric layer 540. Moreover, the nitrogen constituent in the HfON seed dielectric layer 530 may act as a barrier layer to prevent the oxidation of the TiN lower electrode 520 despite the use of the oxygen atmosphere in the thermal stabilization treatment.

Figure 10:
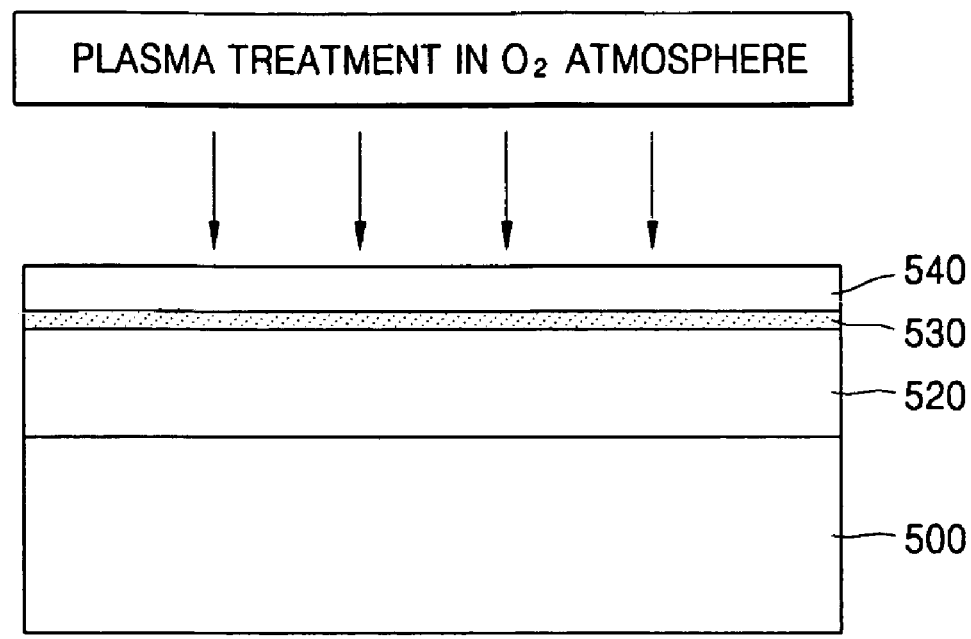

According to FIG. 10, in some embodiments according to the invention, the stabilization treatment may be provided by a plasma treatment in an oxygen atmosphere using, for example, $O_2$, $N_2O$, and/or $NO_2$. In particular, the plasma treatment in the $O_2$ atmosphere can be performed at a relatively low temperature (such as below about 550° C.). The relatively low temperature used during the plasma treatment may help reduce a reaction with the TiN lower electrode 520 while also providing oxygen to the $HfO_2$ main dielectric layer 540 to meet the stoichiometric requirements thereof. Furthermore, the plasma treatment may also help remove the carbon impurities in the $HfO_2$ main dielectric layer 540. Furthermore, as described above, the HfON seed dielectric layer 530 can help prevent the oxidation of the lower electrode 520.

Figure 11:
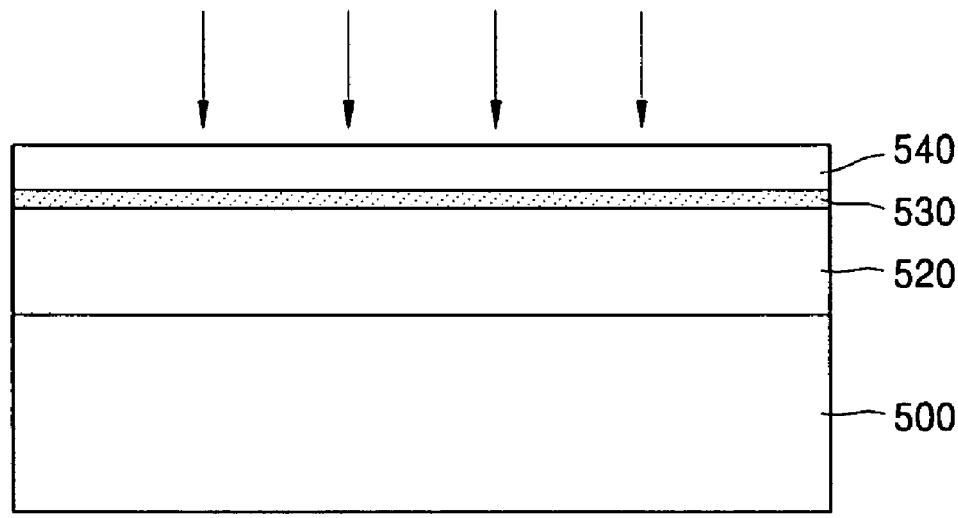

In still other embodiments according to the invention, as illustrated by FIG. 11, the stabilization treatment can be provided by a thermal or plasma treatment in a non-oxygen atmosphere using, for example, $H_2$, $N_2$ and/or $H_3$, which may further remove carbon impurities in the $HfO_2$ main dielectric layer 540. In particular, the $H_2$ atmosphere may provide for more complete removal of carbon impurities in the main dielectric layer 540 so that the stoichiometry thereof more closely approaches that of an $HfO_2$ layer. Using $N_2$ as the atmosphere in the thermal or plasma stabilization treatment may, on the other hand, promotes the formation of HfON as the main dielectric layer 540, whereas use of $NH_3$ as the gas atmosphere in the thermal or plasma stabilization treatment may promote both of the above (i.e., reduction in the carbon impurities as well as further improvement of the barrier characteristics of the seed dielectric layer 530).

Figure 12:
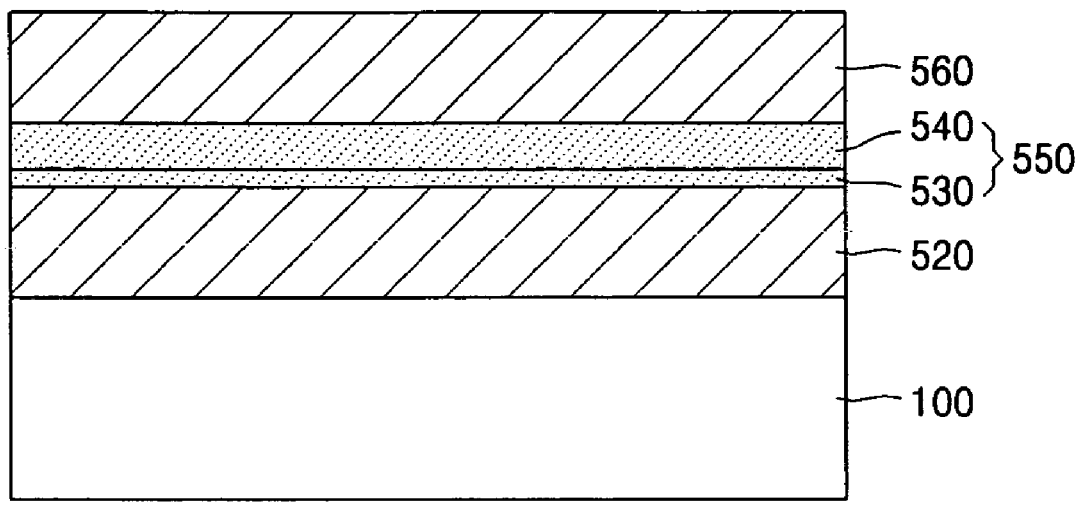
FIG. 12 is a cross-sectional view of a MIM type capacitor according to some embodiments of the present invention.

FIG. 12 is a cross-sectional view that illustrates a MIM type capacitor according to further embodiments of the invention. In particular, the lower electrode 520, including a first metal constituent such as Ti, is on a substrate 500. A metal-oxy-nitride seed dielectric layer 530 is on the lower electrode 520 and includes a second metal constituent that is different from the first metal constituent included in the lower electrode 520. A metal-oxy-nitride main dielectric layer 540 is on the metal-oxy-nitride seed dielectric layer 530 and includes the same metal constituent included therein. It will be understood that the second metal constituent used in the main dielectric layer 540 and the seed dielectric layer 530 can be Hf, Zr, La, or the like. Furthermore, it will be understood that the metal-oxy-nitride composition of the main dielectric layer 540 and seed dielectric layer 530 can be HfON, ZrON, LaON, or the like. Furthermore, it is preferable that the composition of the main dielectric layer 540 and the seed dielectric layer 530 be the same. An upper electrode 560 is on the main dielectric layer 540.

Figure 13:
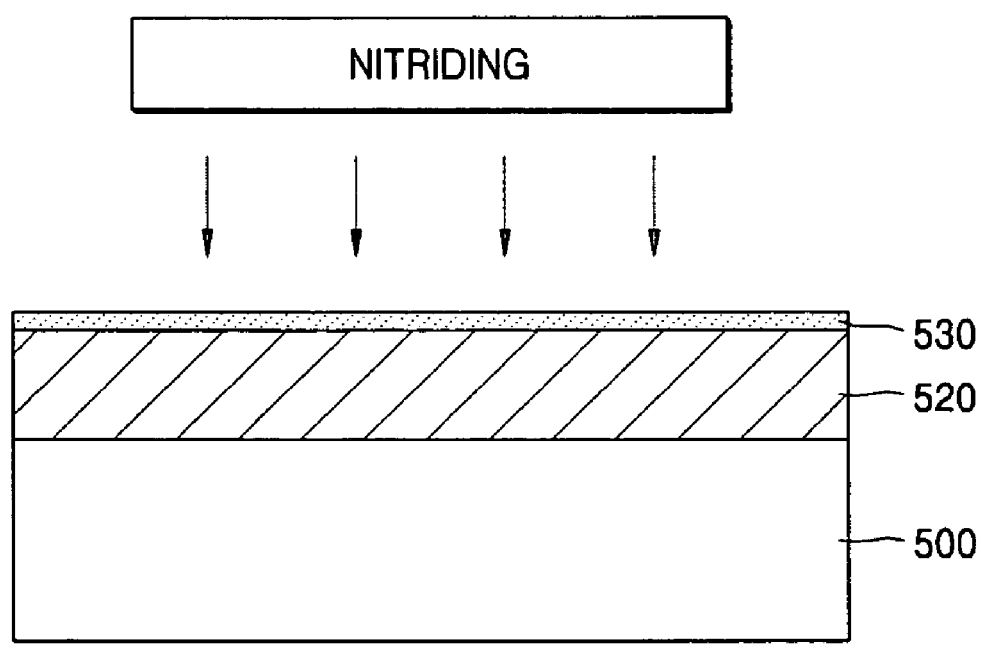
FIGS. 13-14 are cross-sectional views that illustrate the formation of MIM type capacitors according to some embodiments of the present invention.
Figure 14:
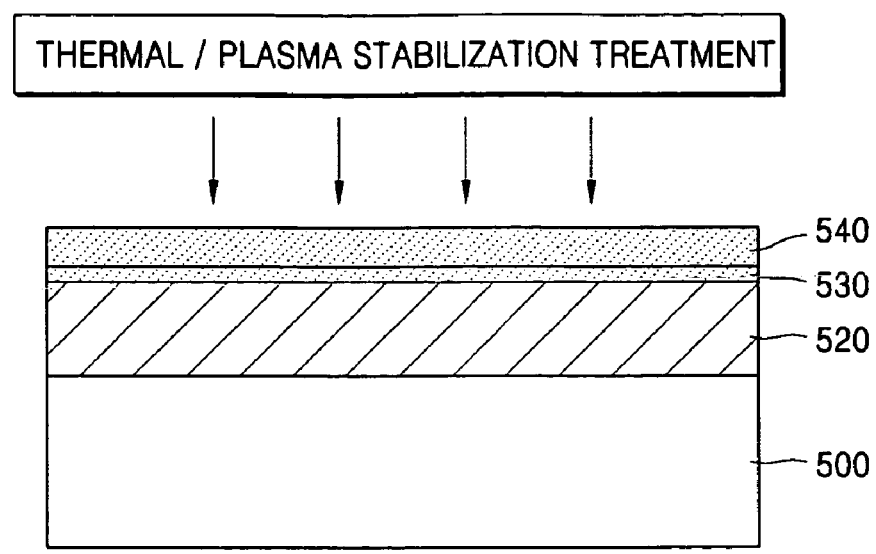

FIGS. 13-14 are cross-sectional views that illustrate the formation of MIM type capacitors according to some embodiments of the invention. According to FIG. 13, the seed dielectric layer 530 ($HfO_2$) is nitrided using a thermal or plasma treatment in a nitrogen atmosphere (such as $N_2$, $NH_3$, $N_2O$, and/or $NO_2$). The $HfO_2$ layer can be formed using ALD or MOCVD as described above. The thermal or plasma treatments in the nitrogen atmosphere can be carried out at a relatively low temperature of about 200° C. to about 550° C. As described above, performing the thermal or plasma treatments at the relatively low temperature can reduce the reaction with the lower electrode 520.

According to FIG. 14, the main dielectric layer 540 is formed on the seed dielectric layer using ALD or MOCVD and is subject to a thermal or plasma stabilization treatment. In particular, the thermal or plasma stabilization treatment is performed in a nitrogen atmosphere using $N_2$, $NH_3$, $N_2O$, and/or $NO_2$. Using the nitrogen atmosphere promotes the formation of the main dielectric layer 540 as a metal-oxy-nitride (such as HfON, ZrON, LaON, or the like). Therefore, the separate main dielectric layer 540 and the seed dielectric 530 may have the same metal-oxy-nitride composition, which may further improve the leakage current characteristics of the resulting MIM type capacitor.

Figure 15:
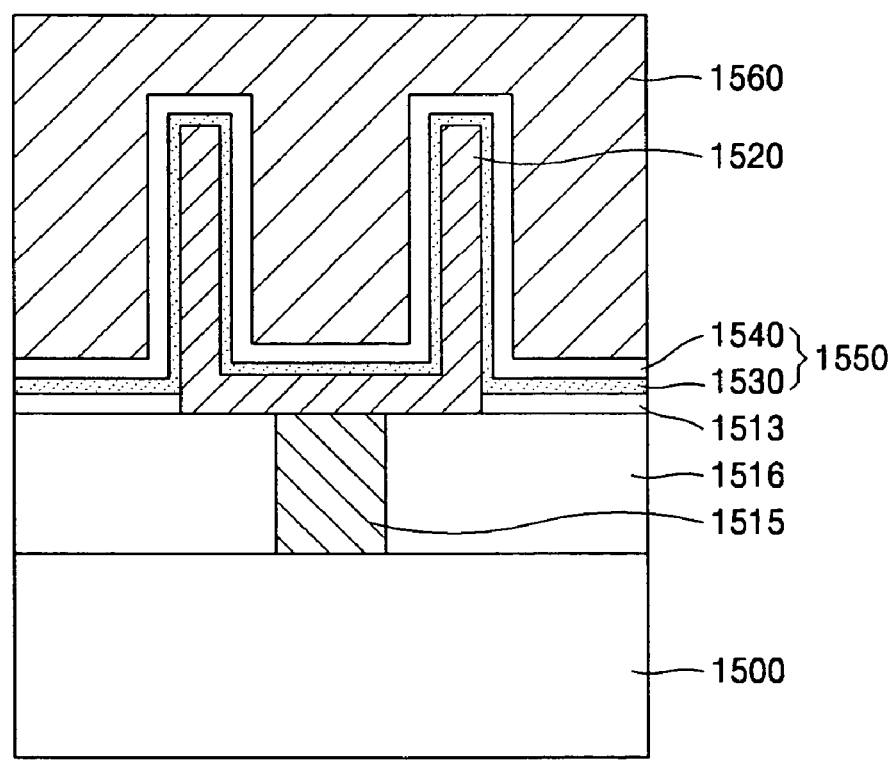
FIG. 15 is a cross-sectional view that illustrates MIM type capacitors according to some embodiments of the present invention.

FIG. 15 is a cross-sectional view of a MIM type capacitor according to some embodiments of the invention. A conductive plug 1515 passes through an inter-dielectric layer 1516 to contact an underlying semiconductor substrate 1500. It will be understood that the conductive plug 1515 can be electrically connected to a MOS transistor, contact, bit line, etc., formed on the semiconductor substrate 1500 as part of an integrated circuit.

A lower electrode 1520 of the MIM type capacitor is formed on the conductive plug 1515 and has a cylindrical shape, which appears as a U-shape in the cross-section of FIG. 15. The lower electrode 1520 can be a metal nitride layer, such as TiN, TaN, or WN. Furthermore, an etch stop layer 1517 is on the inter-dielectric layer 1516 outside the lower electrode 1520. A seed dielectric layer 1530, according to some embodiments of the invention, is conformally on the etch stop layer 1517 and the lower electrode 1520. The seed dielectric layer 1530 can be a metal-oxy-nitride layer of, for example, HfON, ZrON, or LaON.

As further shown in FIG. 15, a main dielectric layer 1540 is conformally on the seed dielectric layer 1530 as a separate layer and, in combination with the seed dielectric layer 1530, provides the dielectric layer 1515 of the MIM type capacitor. The main dielectric layer 1540 can be a metal oxide layer, such as $HfO_2$, ZrO, or LaO. The metal constituent in the seed dielectric layer 1530 and the main dielectric layer 1540 can be the same.

An upper electrode 1560 is on the main dielectric layer 1540 to complete the MIM type capacitor. The metal constituent included in the lower electrode 1520 and the upper electrode 1560 can be the same.

Figure 16:
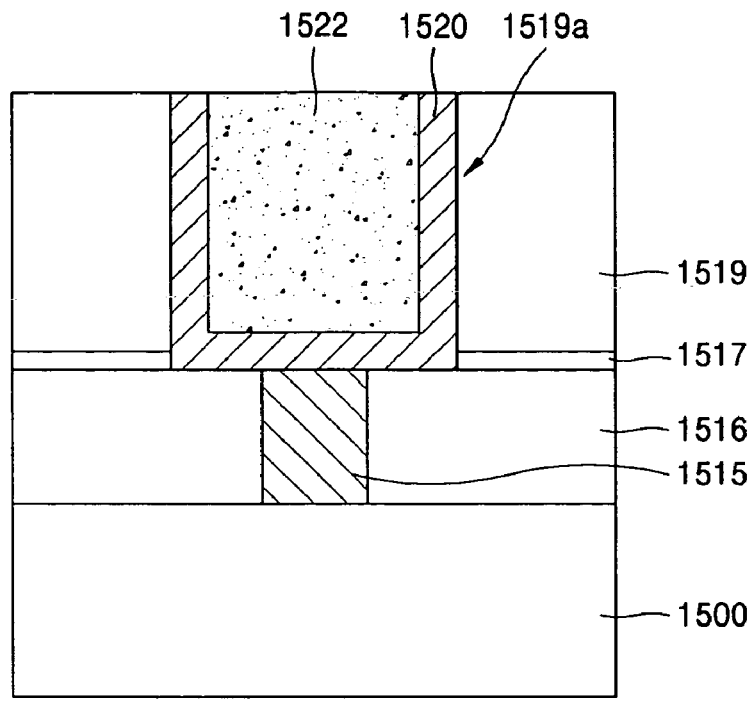
FIGS. 16-18 are cross-sectional views that illustrate the formation of MIM type capacitors according to some embodiments of the present invention.
Figure 17:
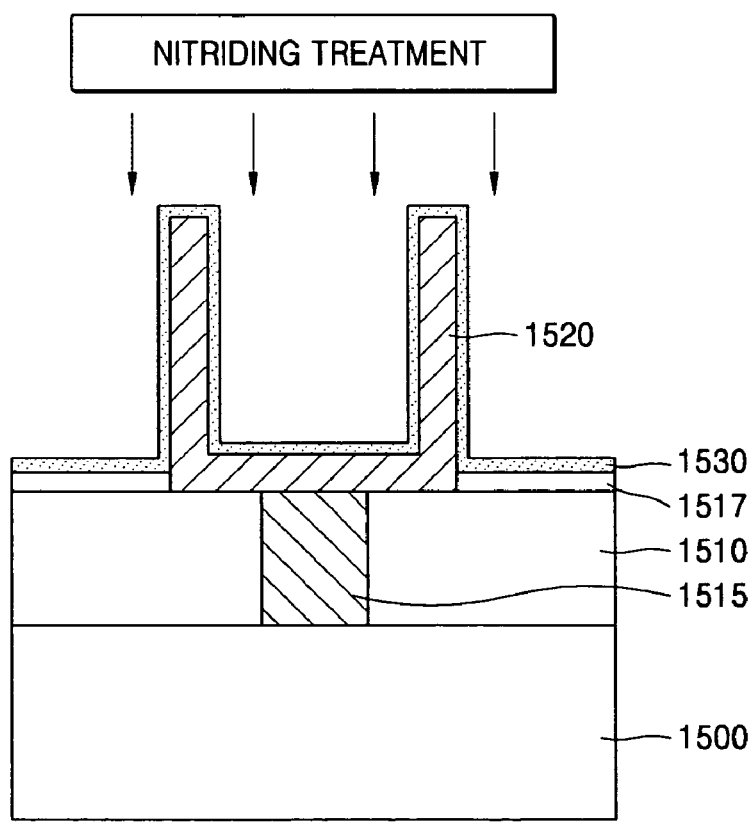
Figure 18:
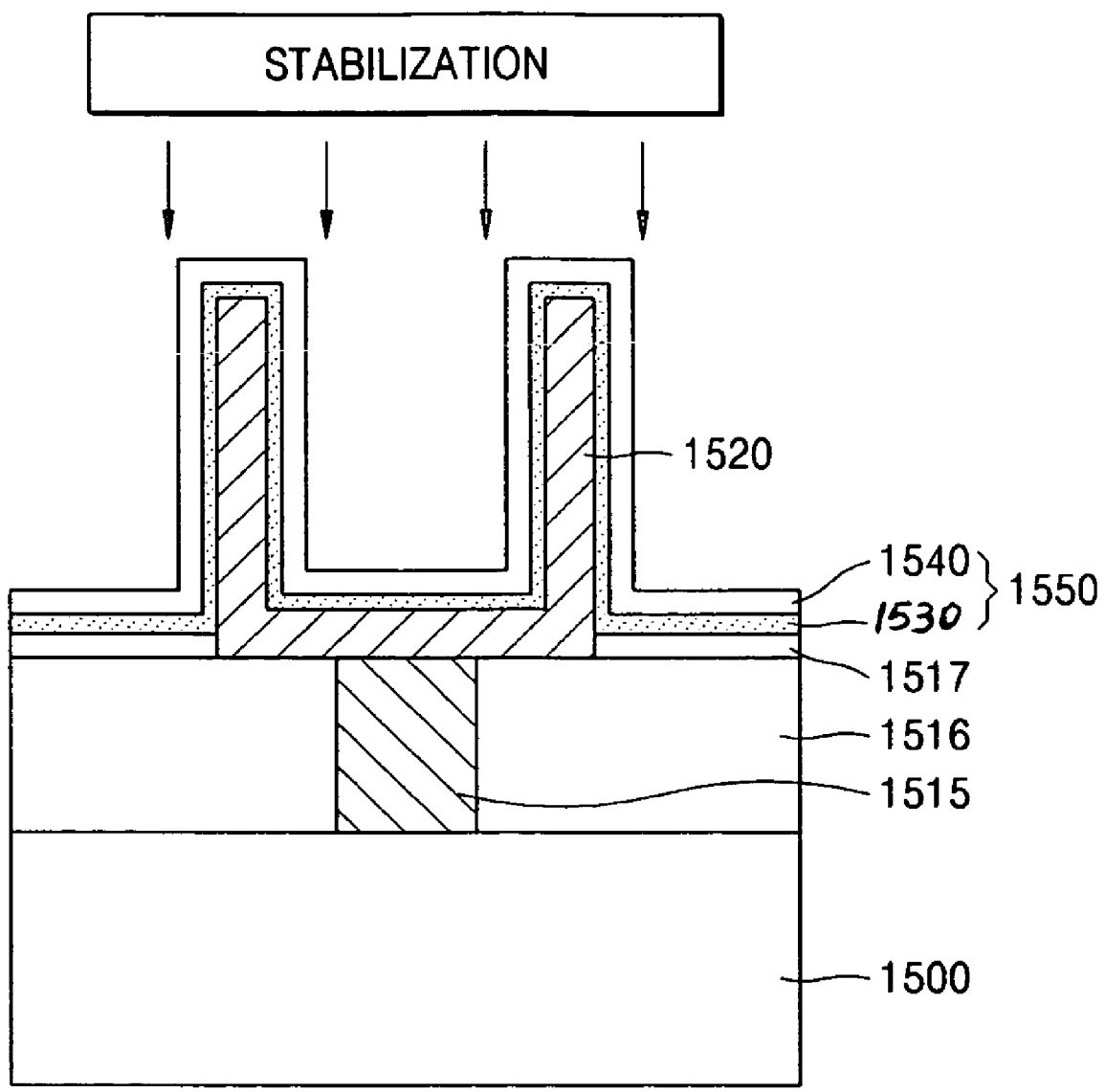

FIGS. 16-18 are cross-sectional views that illustrate the formation of a MIM type capacitor according to some embodiments of the invention. As shown in FIG. 16, the inter-dielectric layer 1516 is deposited on the substrate 1500 and etched to form a contact hole therein that exposes the underlying portion of the substrate 1500, including for example a device or contact therein. The contact hole is filled with a conductive material, such as a doped polysilicon, TiN or WN. The conductive material is planarized to expose a surface of the inter-dielectric layer 1516 to form a conductive plug 1515 in the contact hole.

An etch stop layer 1517 is deposited on the inter-dielectric layer 1516 and on the conductive plug 1515 and mold oxide layer 1519 is formed thereon. It will be understood that the etch stop layer 1517 can be a silicon nitride layer. The etch stop layer 1517 and the mold oxide layer 1519 are etched to form a hole 1519a therein that exposes the underlying conductive plug 1515. The conductive layer (such as TiN, TaN or WN) is formed in the hole 1519a and on an upper surface of the mold oxide layer 1519. It will be understood that the conductive layer is formed to deposit a lower electrode 1520 in the hole 1519a and can be formed using, for example, ALD, MOCVD, or CVD to promote a uniform thickness of the lower electrode 1520.

A sacrificial layer 1522 is deposited on the conductive layer including in the hole 1519a and is planarized using chemical mechanical polishing or an etch back process, which removes the portion of the conductive layer located on the upper surface of the mold oxide layer 1519 but leaves the portion in the hole 1519a to form the lower electrode 1520.

According to FIG. 17, the sacrificial layer 1522 and the mold oxide layer 1519 are removed using a wet etch. The preliminary seed dielectric layer is formed on a surface of the lower electrode 1520 and on a surface of the etch stop layer 1517. It will be understood that the preliminary seed dielectric layer is formed of a metal oxide material.

The preliminary seed dielectric layer is nitrided to form the seed dielectric layer 1530 of a metal-oxy-nitride (such as HfON, ZrON, or LaON). Furthermore, the seed dielectric layer 1530 is formed to a thickness from about 20 Å to about 60 Å. According to FIG. 18, the main dielectric layer 1540 is formed on the seed dielectric layer 1530 using ALD or MOCVD. It will be understood that the main dielectric layer can be a material such as $HfO_2$, ZrO, or LaO. Furthermore, the metal constituent included in the main dielectric layer 1540 is the same as the metal constituent included in the seed dielectric layer 1530.

The main dielectric layer 1540 is subject to a thermal or plasma stabilization treatment to remove impurities (such as carbon) and to adjust the stoichiometry of the main dielectric layer. Furthermore, the stabilization treatment can be performed at a temperature of less than about 550° C. Moreover, the thermal or plasma treatments used to stabilize the main dielectric layer 1540 can be performed in an oxygen atmosphere or in a non-oxygen atmosphere as described above. If the thermal or plasma treatment in a non-oxygen atmosphere is performed using nitrogen, the metal-oxide material of the main dielectric layer 1540 may be further subject to nitridization, which may further improve barrier effect provided by the seed dielectric layer 1530.

Figure 19:
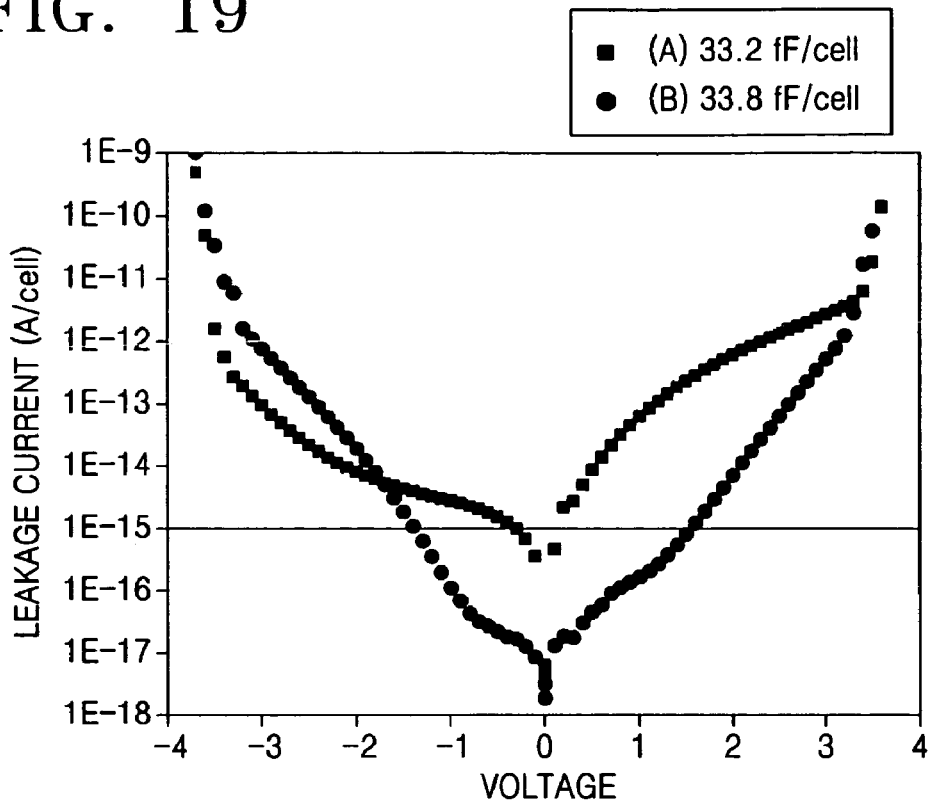
FIG. 19 is a graph that illustrates leakage currents of MIM type capacitors formed according to some embodiments of the present invention relative to the conventional art.

FIG. 19 is a graph that illustrates comparative leakage current density measurements in a MIM type capacitor according to some embodiments of the invention and according to the conventional art. In particular, FIG. 19 includes two curves: "A" and "B." Curve A represents leakage current density measurements made on a conventional MIM type capacitor including an $HfO_2$ dielectric layer, whereas Curve B illustrates leakage current density measurements made on a MIM type capacitor according to embodiments of the invention, including a separate HfON seed layer as part of the dielectric layer therein. As shown in FIG. 19, the leakage current density associated with the MIM type capacitor formed according to some embodiments of the invention is reduced compared to those in Curve A (no seed layer).

Figure 20:
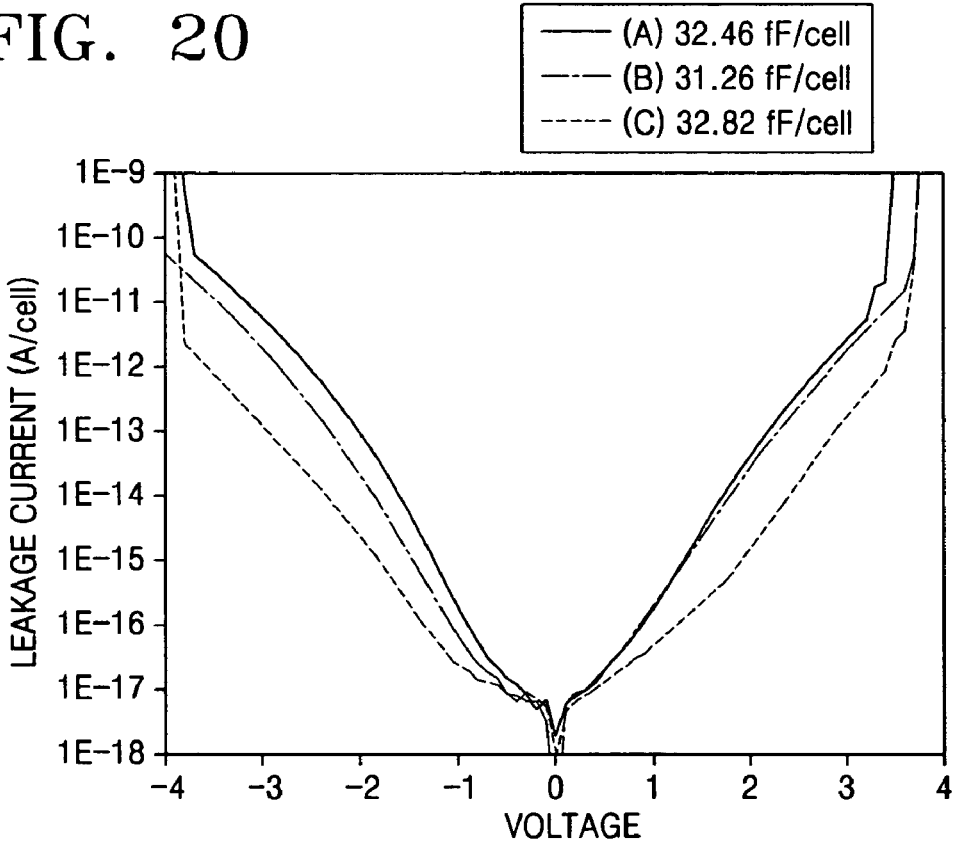
FIG. 20 is a graph that illustrates leakage current of a MIM type capacitor formed according to some embodiment of the present invention relative to the conventional art.
Figure 21:
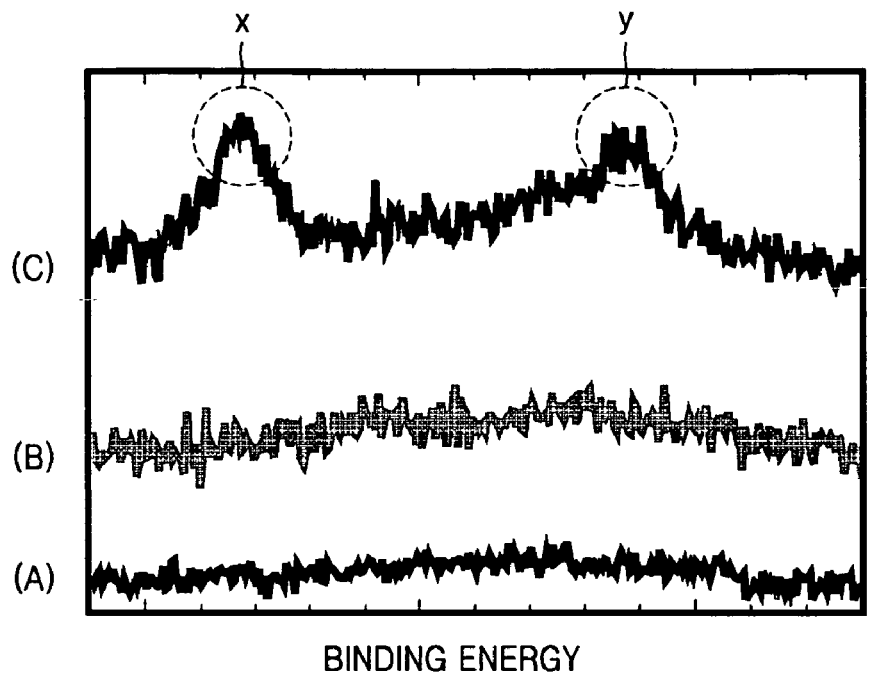
FIG. 21 is x-ray photoelectron spectroscopy of a MIM type capacitor formed according to some embodiments of the present invention.
Figure 22:
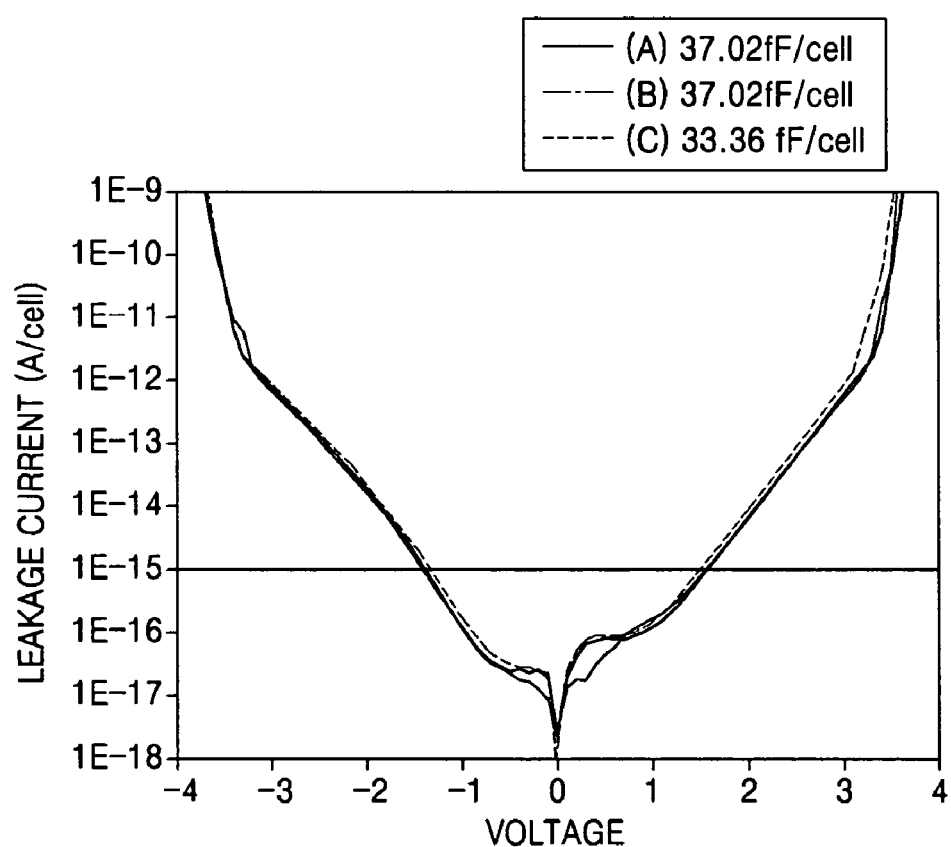
FIG. 22 is a graph that illustrates leakage currents of MIM type capacitors formed according to some embodiments of the invention at different stages.

FIGS. 20-22 show experimental data collected by testing MIM type capacitors according to some embodiments of the invention compared to the conventional art. In particular, FIG. 20 is a graph that illustrates variation in leakage current density as a result of three different stabilization treatments: no stabilization treatment shown in Curve A, an $NH_3$ plasma treatment as shown in Curve B, and an $O_2$ plasma treatment as shown in Curve C. According to FIG. 20, Curve C shows that improved leakage current can be provided by the stabilization using, in particular, plasma treatment in an oxygen atmosphere. Moreover, FIG. 20 illustrates that the stabilization treatment can provide benefits independent of the formation of the seed layer.

FIG. 21 is a graph of binding energy measured using x-ray photoelectron spectroscopy. In particular, FIG. 21 shows binding energy measured on a MIM type capacitor including a seed dielectric layer and a separate main dielectric layer included therein. The three curves in FIG. 21 illustrate the variation in binding energy according to different plasma treatments used as stabilization for the main dielectric layer. In particular, Curve A shows the binding energy measurements for an $HfO_2$ main dielectric layer that is not treated for stabilization. Curve B shows the binding energy measurements for an $HfO_2$ main dielectric layer that is stabilized in a plasma treatment using an $O_2$ atmosphere. Curve C shows the binding energy measured for a MIM type capacitor having an $HfO_2$ main dielectric layer, which is stabilized using a plasma treatment in an $NH_3$ atmosphere. Furthermore, regions X and Y shown in FIG. 21 associated with Curve C highlight the peak binding energy associated with the nitrogen in the oxy-nitride and the nitrogen in the metal-nitride, respectively. Accordingly, Curve C illustrates the main dielectric layer stabilized using the plasma treatment in the NH$_3$ atmosphere incorporate the nitrogen.

FIG. 22 is a graph showing leakage current density measurements for MIM type capacitors formed according to some embodiments of the invention. In particular, the curve designated as A in FIG. 22 represents leakage current density measurements for a MIM type capacitor after the formation of a structure (including a TiN lower electrode having a HfON seed layer and an HfO$_2$ main dielectric layer thereon with the TiN upper electrode). Curve B represents leakage current density measurements after the structure is subject to back-end processing at about 500° C. Curve C shows leakage current density measurements on the structure after back-end processing at about 550° C. Therefore, as shown in FIG. 22, the leakage current density measurements of a MIM type capacitor formed according to some embodiments of the invention may be reduced regardless whether the back-end processing is performed at a relatively high temperature such as 500 or 550° C.

As described above, in some embodiments according to the invention, a metal-oxy-nitride seed dielectric layer can be formed on a metal-nitride lower electrode of a metal-insulator-metal (MIM) type capacitor. The metal-oxy-nitride seed dielectric layer can act as a barrier layer to reduce a reaction with the metal-nitride lower electrode during, for example, backend processing used to form upper levels of metallization/structures in an integrated circuit including the MIM type capacitor. The metal-oxy-nitride seed dielectric layer may also reduce stress that could otherwise be induced during backend thermal processing.

The nitrogen included in the metal-oxy-nitride seed dielectric layer can reduce the type of reaction, which may occur in conventional type MIM capacitors. In further embodiments according to the invention, a metal-oxide main dielectric layer can be formed on the metal-oxy-nitride seed dielectric layer and can remain separate from the metal-oxy-nitride seed dielectric layer in the MIM type capacitor. Furthermore, in some embodiments according to the invention, the metal-oxide main dielectric layer can be stabilized (using, for example, a thermal or plasma treatment) to remove defects (such as carbon) therefrom and to adjust the stoichiometry of the metal-oxide main dielectric layer.

Many alterations and modifications may be made by those having ordinary skill in the art, given the benefit of the present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed:

1. A method of forming a dielectric layer in a capacitor comprising:
   forming a metal-oxy-nitride seed dielectric layer on a metal-nitride lower electrode using Atomic Layer Deposition (ALD) with a precursor gas including a metal and oxygen;
   growing a metal-oxide main dielectric layer from the metal-oxy-nitride seed dielectric layer directly on the metal-oxy-nitride seed dielectric layer; and
   treating the metal-oxy-nitride seed dielectric layer and the metal-oxide main dielectric layer using a thermal treatment or a plasma treatment to lower a crystallization temperature of the metal-oxide main dielectric layer.

2. A method according to claim 1 wherein a first metal constituent in the metal-nitride lower electrode and a second metal constituent in the metal-oxy-nitride seed dielectric layer comprise different metal constituents.

3. A method according to claim 2 wherein the different metal constituents comprise Ti, W, Ta, Hf, Zr, or La.

4. A method according to claim 1 wherein a first metal constituent in the metal-oxy-nitride seed dielectric layer and a second metal constituent in the metal-oxide main dielectric layer comprise the same metal constituent.

5. A method according to claim 4 wherein the same metal constituent comprises Ti, W, Ta, Hf, Zr, or La.

6. A method according to claim 1 wherein a metal constituent in the metal-oxide main dielectric layer and a metal constituent in the metal-oxy-nitride seed dielectric layer comprise the same metal constituents.

7. A method according to claim 1 wherein a second metal constituent in the metal-oxide main dielectric layer and a first metal constituent in the metal-oxy-nitride seed dielectric layer comprise different metal constituents.

8. A method according to claim 7 wherein the different metal constituents comprise Ti, W, Ta, Hf, Zr, or La.

9. A method according to claim 1 further comprising:
   forming the metal-oxy-nitride seed dielectric layer to a thickness of about 20 to about 60 Angstroms; and
   forming the metal-oxide main dielectric layer to a thickness of about 40 to about 100 Angstroms.

10. A method according to claim 1 wherein treating comprises treating the metal-oxide main dielectric layer using the thermal treatment or the plasma treatment in a non-oxygen atmosphere.

11. A method according to claim 10 wherein the non-oxygen atmosphere comprises H$_2$, NH$_3$ and/or N$_2$.

12. A method according to claim 1 wherein treating the metal-oxide main dielectric layer using thermal treatment comprises treating the metal-oxide main dielectric layer in an oxygen atmosphere at a temperature less than about 550 Centigrade.

13. A method according to claim 12 wherein the oxygen atmosphere comprises O$_2$, NO$_2$ and/or N$_2$O.

14. A method according to claim 1 wherein treating the metal-oxide main dielectric layer using plasma treatment comprises treating metal-oxide main dielectric layer using plasma treatment in an oxygen atmosphere at a temperature less than about 550 Centigrade.

15. A method according to claim 1 wherein forming a metal-oxy-nitride seed dielectric layer comprises:
   forming a thin metal-oxy seed dielectric layer on the metal-nitride lower electrode; and
   nitriding the thin metal-oxy seed dielectric layer.

16. A method according to claim 15 wherein nitriding comprises using a plasma treatment in a nitrogen atmosphere at a temperature of about 200 degrees Centigrade and about 550 degrees Centigrade.

17. A method according to claim 15 wherein nitriding comprises a thermal treatment in a nitrogen atmosphere at a temperature greater than or equal to about 550 degrees Centigrade.

18. A method according to claim 1 further comprising:
   forming an upper electrode on the metal-oxide main dielectric layer, wherein a metal constituent included in the upper electrode is different than a metal constituent included in metal-oxide main dielectric layer.

* * * * *